United States Patent
Kuo (10) Patent No.: US 9,378,822 B2
(45) Date of Patent: Jun. 28, 2016

(54) METHOD FOR PROGRAMMING SELECTED MEMORY CELLS IN NONVOLATILE MEMORY DEVICE AND NONVOLATILE MEMORY DEVICE THEREOF

(71) Applicant: ELITE SEMICONDUCTOR MEMORY TECHNOLOGY INC., Hsinchu (TW)

(72) Inventor: Chung-Shan Kuo, New Taipei (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 111 days.

(21) Appl. No.: 14/280,606

(22) Filed: May 17, 2014

(65) Prior Publication Data

US 2015/0332769 A1    Nov. 19, 2015

(51) Int. Cl.
*G11C 16/10*  (2006.01)
*G11C 13/00*  (2006.01)
*G11C 16/08*  (2006.01)
*G11C 16/34*  (2006.01)

(52) U.S. Cl.
CPC ............ *G11C 16/10* (2013.01); *G11C 13/0069* (2013.01); *G11C 16/08* (2013.01); *G11C 16/3418* (2013.01); *G11C 16/3427* (2013.01); *G11C 2013/0092* (2013.01)

(58) Field of Classification Search
USPC .................................................... 365/185, 19
See application file for complete search history.

(56) References Cited

U.S. PATENT DOCUMENTS

| 6,392,931 B1* | 5/2002 | Pasotti | G11C 11/5628 |
| | | | 365/185.14 |
| 8,854,890 B1* | 10/2014 | Miwa | G11C 16/0483 |
| | | | 365/185.02 |
| 2006/0077736 A1* | 4/2006 | Nakagawa | G11C 16/12 |
| | | | 365/201 |
| 2009/0296460 A1* | 12/2009 | Kanda | G11C 11/16 |
| | | | 365/171 |

\* cited by examiner

*Primary Examiner* — Huan Hoang
*Assistant Examiner* — Minh Dinh
(74) *Attorney, Agent, or Firm* — Li & Cai Intellectual Property (USA) Office (57) ABSTRACT

A method for programming memory cells of a selected word line has steps of: providing a first word line programming signal being at plurality of voltage levels in different programming slots of a current programming operation to the memory cells of the selected word line, wherein the first word line programming signal is a ramping voltage signal; and providing a second line programming signal being at plurality of voltage levels in different programming slots of a next programming operation to the memory cells of the selected word line, wherein the second word line programming signal is another one ramping voltage signal; wherein the highest voltage levels of the first and second word line programming signals are identical to each other, and a number of the voltage levels of the first word line programming signal is larger than that of the second word line programming signal.

16 Claims, 5 Drawing Sheets

METHOD FOR PROGRAMMING SELECTED MEMORY CELLS IN NONVOLATILE MEMORY DEVICE AND NONVOLATILE MEMORY DEVICE THEREOF

BACKGROUND

1. Technical Field

The present disclosure is related to a memory device, and in particular to, a method for programming selected memory cells in a nonvolatile memory device and the nonvolatile memory device thereof.

2. Description of Related Art

Currently, the memory device technology develops fast, and the memory devices with large capacities are usually used in our daily life. The nonvolatile memory device has a plurality of memory cells which have floating gate transistors to be cleared in a transient state. In the transient state, each of the floating gate transistors may have a threshold voltage of about 3V. To program a selected memory cell, a program voltage, for example 9V, should be applied to a word line of the selected memory cell for a predetermined time period, wherein the predetermined time period is also called a program time or a programming interval. The threshold voltage of the floating gate transistor of the selected memory cell may be thus raised to a higher voltage, but the threshold voltages of the floating gate transistors of the non-selected memory cells are not raised.

However, some problems may arise when at least one memory cell is selected for programming among the memory cells of a selected word line. For example, when a program voltage is applied to a selected word line, the program voltage may be applied not only to the selected memory cells, but also to the non-selected memory cells of the selected word line. As a result, the non-selected memory cells of the selected word line may also be programmed when the selected memory cells of the selected word line are programmed. This problem is referred to as a "program disturb" fault, which is an unintended programming of the non-selected memory cell of the selected word line.

To avoid the above mentioned problems, a ramping word line programming scheme is thus provided. To achieve the ramping word line programming scheme, a charge pump is thus needed. The ramping word line programming scheme ramps the provided voltage step by step. Along with the advancement of the semiconductor process, the smaller the transistor size is, the larger the resistance of the bit line is. Thus, when the word line is selected to program at least one the selected memory cell of the word line, and the selected memory cell is located at a tail end of the bit line, the programming ability is reduced since the resistance of the bit line decreases the voltage applied to the memory cell from the bit line. Even, the charge pump may increase the supplied programming voltage, and/or the voltage applied on the bit line can be increased, so as to solve the above problem. However, the "program disturb" fault cannot still avoided, and the chip area is increased, while the charge pump must provide the higher programming voltage. Furthermore, the more the ramping times of the programming voltage are, the longer the programming interval is.

SUMMARY

An exemplary embodiment of the present disclosure provides a method for programming memory cells of a selected word line associated with a nonvolatile memory device, having steps of: providing a first word line programming signal being at plurality of voltage levels in different programming slots of a current programming operation to the memory cells of the selected word line, wherein the first word line programming signal is a ramping voltage signal; and providing a second line programming signal being at plurality of voltage levels in different programming slots of a next programming operation to the memory cells of the selected word line, wherein the second word line programming signal is another one ramping voltage signal; wherein a highest voltage level of the first word line programming signal is the same as that of the second word line programming signal, and a number of the voltage levels of the first word line programming signal is larger than that of the second word line programming signal.

An exemplary embodiment of the present disclosure provides a nonvolatile memory device comprising a memory array, a bit line decoder, a word line decoder, a first high voltage generator, and a second high voltage generator. The memory array comprises a plurality of memory cells. The bit line decoder and a word line decoder are electrically connected to the memory array. The first high voltage generator electrically connected to the word line decoder provides a first word line programming signal being at plurality of voltage levels in different programming slots of a current programming operation to the memory cells of the selected word line, wherein the first word line programming signal is a ramping voltage signal. Then, the first high voltage generator provides a second line programming signal being at plurality of voltage levels in different programming slots of a next programming operation to the memory cells of the selected word line, wherein the second word line programming signal is another one ramping voltage signal. The second high voltage generator electrically connected to the bit line decoder outputs a bit line programming voltage, and the bit line decoder outputs the bit line programming voltage as at least of bit line signals. A highest voltage level of the first word line programming signal is the same as that of the second word line programming signal, and a number of the voltage levels of the first word line programming signal is larger than that of the second word line programming signal.

To sum up, the method for programming selected memory cells in a nonvolatile memory device and the nonvolatile memory device thereof provided by the exemplary embodiments of the present disclosure has advantages of fast programming, and low voltage drops on the bit lines.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or similar parts.

[Exemplary Embodiment of Nonvolatile Memory Device]

Figure 1:
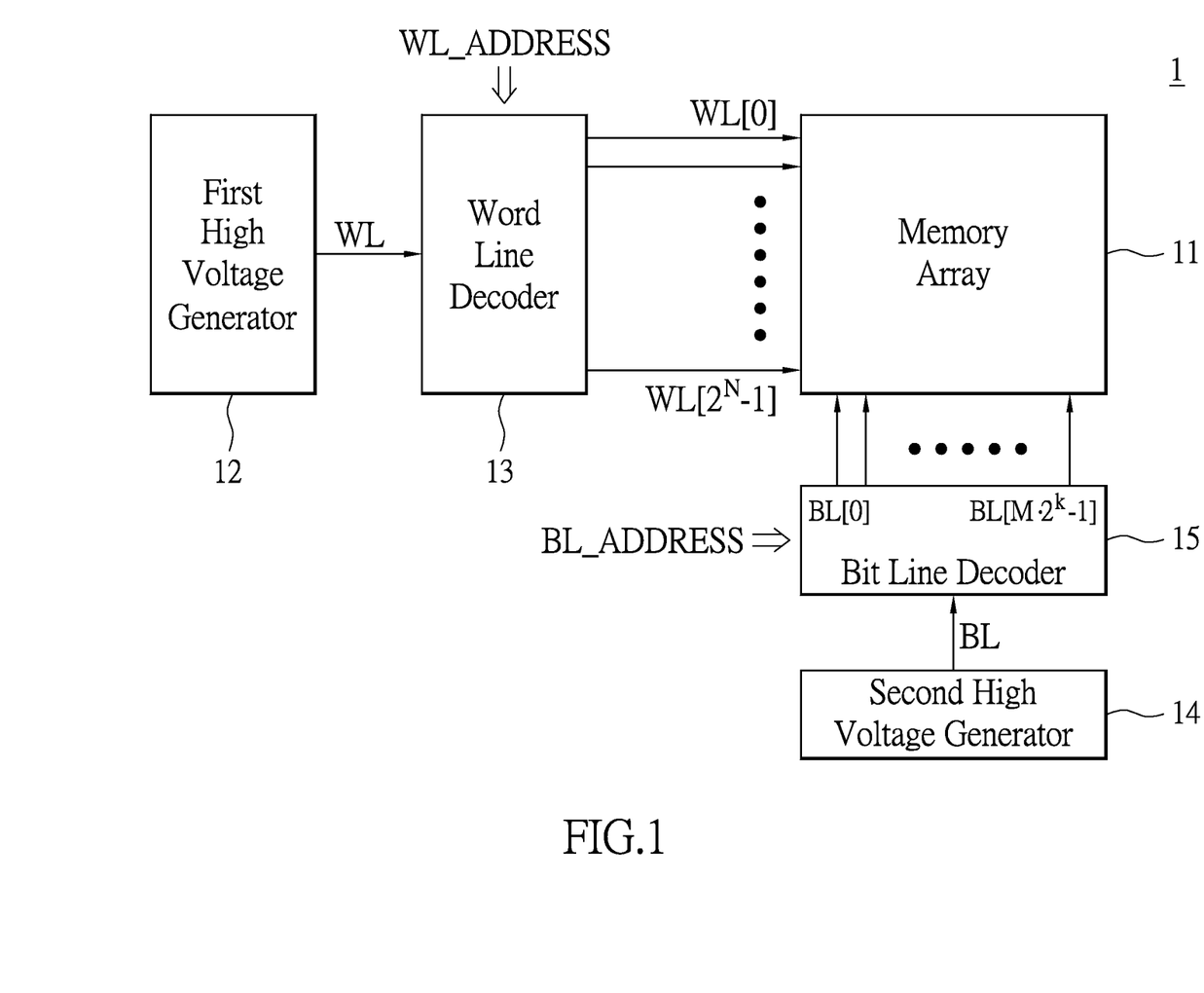
FIG. 1 is a block diagram of a memory array of a nonvolatile memory device according to an exemplary embodiment of the present disclosure.
Figure 2A:
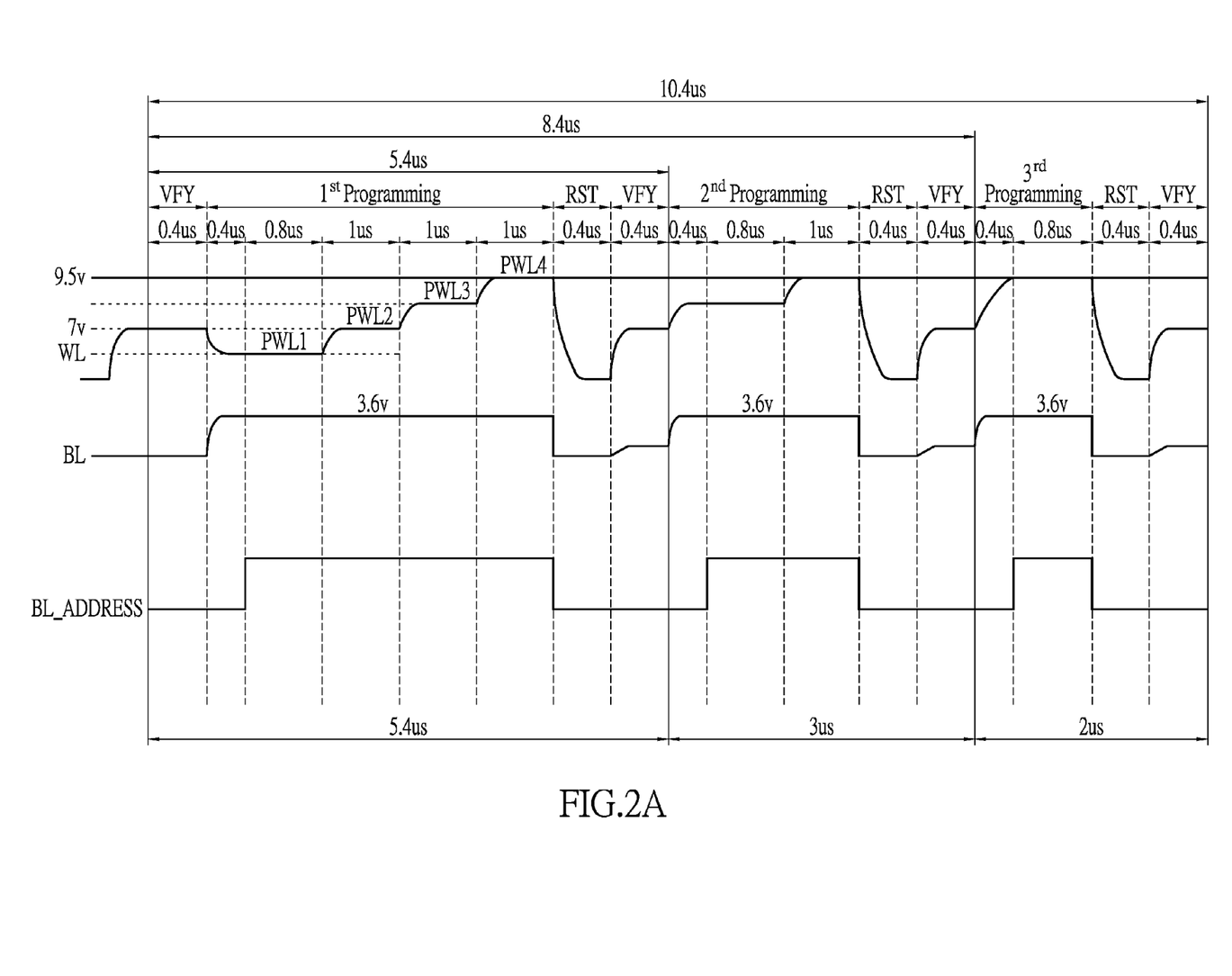
FIG. 2A is a waveform diagram showing a programming voltage signal at a word line, a bit line voltage signal at bit lines, and a bit line address signal according to an exemplary embodiment of the present disclosure.
Figure 2B:
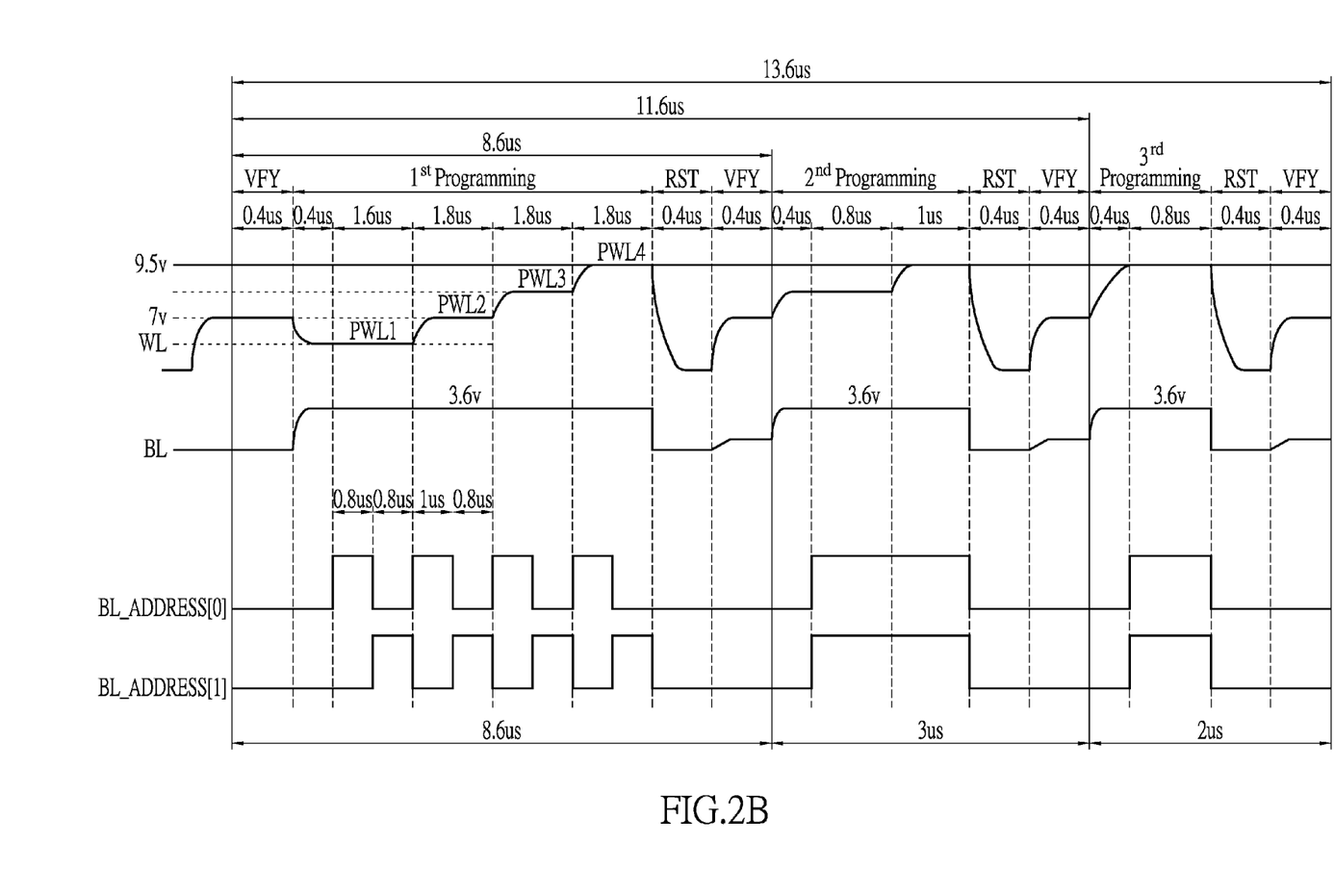
FIG. 2B is a waveform diagram showing a word line programming signal, a bit line programming signal at bit lines, and a bit line address signal according to another exemplary embodiment of the present disclosure.
Figure 2C:
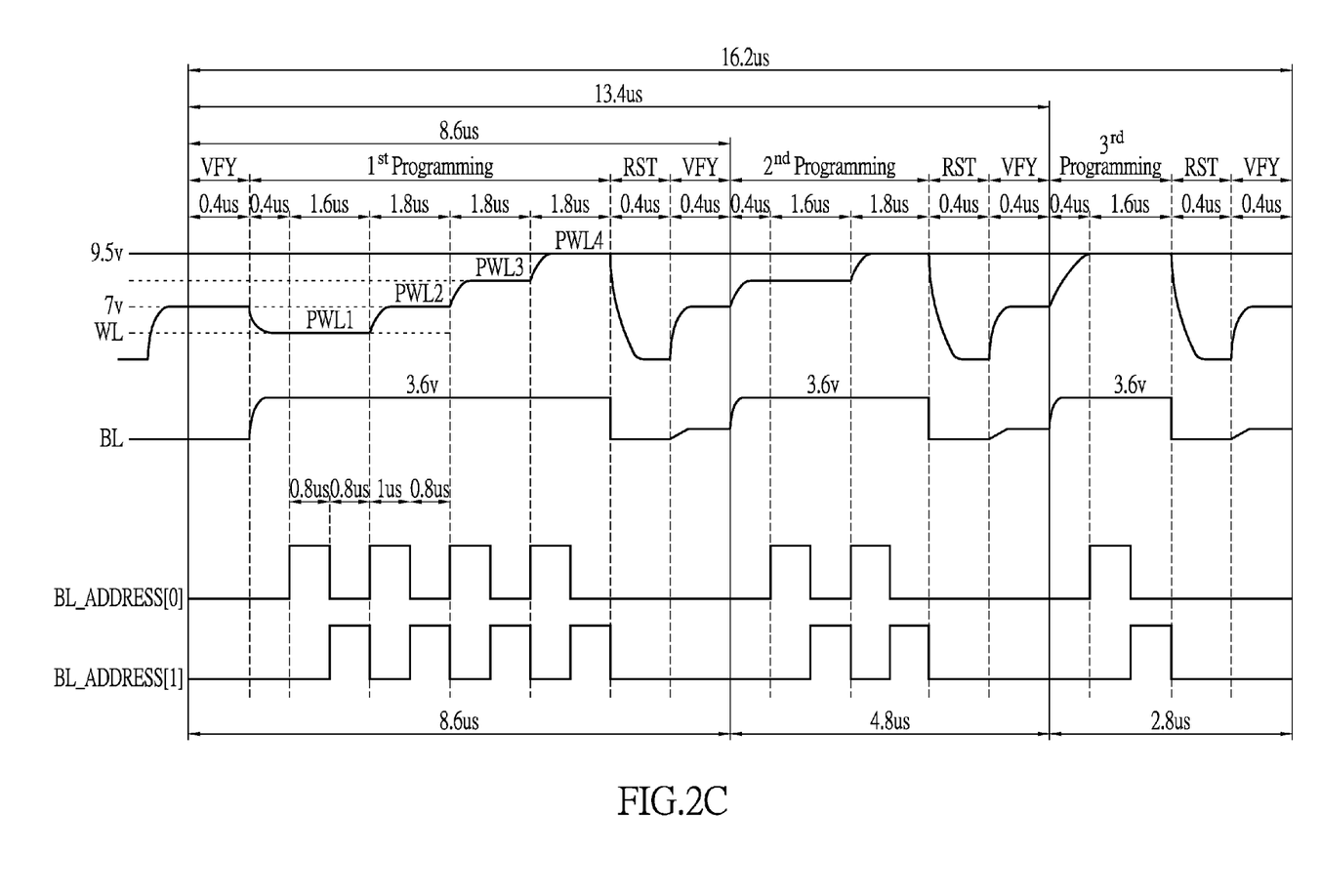
FIG. 2C is a waveform diagram showing a word line programming signal, a bit line programming signal at bit lines, and a bit line address signal according to another exemplary embodiment of the present disclosure.

Referring to FIG. 1 and FIG. 2, FIG. 1 is a block diagram of a memory array of a nonvolatile memory device according to an exemplary embodiment of the present disclosure. The nonvolatile memory device 1 comprises a memory array 11, a first high voltage generator 12, a word line decoder 13, a second high voltage generator 14 and a bit line decoder 15. The memory array 11 is electrically connected to the word line decoder 13 and the bit line decoder 15, and the first high voltage generator 12 and the second high voltage generator 14 are respectively electrically connected to the word line decoder 13 and the bit line decoder 15.

The nonvolatile memory device 1 can be a flash memory device, and the memory array 11 comprises a plurality of memory cells, such as floating gate transistors. The memory cells can be selectively divided into M bit line groups, wherein M is an integer larger than 1. The bit line groups receive a plurality of word line selection signals WL[0] through WL[$2^N$-1] from the word line decoder 13, wherein N is the number of the bits associated with a word line address signal WL_ADDRESS.

The memory cell has a control gate for receiving the word line selection signal (for example, WL[0]), a drain for receiving the bit line signal (for example, BL[0]), and a source for electrically connecting to a ground GND during the programming procedure.

During the programming procedure, the first bit line group among the bit line groups receives a plurality of bit line signals BL[0] through BL[$2^K$-1], and by the similar manner, the $M^{th}$ bit line group among the bit line groups receives a plurality of bit line signals BL[(M-1)·$2^K$] through BL[M·$2^K$-1] from the bit line decoder 15, wherein N and K are integers larger than 1. For example, M can be equal to 2, N can be equal to 5, and K can be equal to 4.

The first high voltage generator 12 generates a word line programming signal WL, and the second high voltage generator 14 generates a bit line programming signal BL. The bit line address signal BL_ADDRESS has N bits, wherein the word line programming signal WL is output to the word line decoder 13, and according to the word line address signal WL_ADDRESS, the word line decoder 13 outputs the word line programming signal WL as one of the word line signals WL[0] through WL[$2^N$-1]. The bit line programming signal BL is output to the bit line decoder 14, and according to the bit line address signal BL_ADDRESS, the bit line decoder 14 outputs the bit line programming signal BL as at least one of the bit line signals.

It is noted that, the word line programming signal WL with the programming voltage is a ramping voltage signal. In the programming procedure, the memory cells of the selected word line are programmed in a plurality of programming operations. The word line programming signal WL has n voltage levels in the current programming operation, and m voltage levels in the next programming operation, wherein n is a positive integer larger than 1, and m is a positive integer less than n. The highest voltage levels of the word line programming signal WL in the different programming operations are substantially identical to each other.

Since the word line programming signal WL with the programming voltage is a ramping voltage signal, the current passed through the bit line is decreased and the voltage drop on the bit line is lowered. Accordingly, the word line programming signal WL with the programming voltage is sufficient to program the selected memory cell. The highest voltage levels of the word line programming signal WL in the different programming operations are set to be substantially identical to each other, and the threshold voltage of the memory cell may be increased in the current programming operation, such that under the same charge pump capability, the number which the memory cells can be programmed is increased in the next programming operation. It is noted that the programming voltage supplied by the charge pump can be fixed, and the chip area is thus reduced. In short, the nonvolatile memory device 1 can fast program the memory cells of the selected word line, and the voltage drops on the bit lines are lowered.

The selected memory cells of the selected word line in the different bit line groups can be programmed simultaneously or separately in the programming operation via the control of the bit line address signal BL_ADDRESS. For example, the memory cells of the selected word line in the first bit line group are programmed firstly in the programming operation, and after the selected memory cells of the selected word line in the first bit line group are programmed, the memory cells of the selected word line in the second bit line group are programmed.

It is noted that, a large current may be needed if selected memory cells of the selected word line in the different bit line groups can be programmed simultaneously once to accomplish the programming procedure. Thus to decrease the needed large current mentioned above, the selected memory cells of the selected word line in the different bit line groups can be programmed simultaneously in the current programming operation to increase the threshold voltage of the selected memory cells of the selected word line, and then the memory cells of the selected word line in the different bit line groups can be programmed separately or simultaneously in the next programming operation.

The details of the waveform of the word line programming signal WL, the bit line programming signal BL, and the bit line address signal BL_ADDRESS are depicted in the next descriptions with different exemplary embodiments.

Please refer to FIG. 2A. FIG. 2A is a waveform diagram showing a programming voltage signal at a word line, a bit line voltage signal at bit lines, and a bit line address signal according to an exemplary embodiment of the present disclosure.

In the exemplary embodiment, M is equal to 2, K is equal to 4, the bit line programming signal BL is output as at least one of the bit line signals BL[0] through BL[31] according to the bit line address signal BL_ADDRESS, and the 10.4 μs programming procedure for programming the memory cells of the selected word line has three programming operations. When the word line related to the word line selection signal WL[0] is for example selected (i.e. the word line programming signal WL is output as the word line selection signal WL[0]), the 10.4 μs programming procedure for programming the memory cells of the selected word line WL[0] begins. Before the 10 μs programming procedure for programming the memory cells of the selected word line WL[0] begins, the word line programming signal WL increases to 7 volt.

Then, in the 0.4 μs front verify slot VFY of the 5.4 μs first programming operation, the word line programming signal WL maintains 7 volt, and the bit line address signal BL_ADDRESS and the bit line programming voltage BL maintain a logic low voltage level (such as 0 volt). Next, in the 0.4 μs transient slot of the 5.4 μs first programming operation, the word line programming signal WL decreases to the first voltage level PWL1, the bit line programming voltage BL increases to 3.6 volt, and the bit line address signal BL_ADDRESS maintains the logic low voltage level.

Next, in the 0.8 μs first programming slot of the 5.4 μs first programming operation, the word line programming voltage WL maintains the first voltage level PWL1, the bit line programming voltage BL maintains to 3.6 volt, and the bit line address signal BL_ADDRESS maintains the logic high voltage level. Then, in the 1 μs second programming slot of the 5.4 μs first programming operation, the word line programming voltage WL increases to the second voltage level PWL2, the bit line programming voltage BL maintains to 3.6 volt, and the bit line address signal BL_ADDRESS maintains the logic high voltage level.

Next, in the 1 μs third programming slot of the 5.4 μs first programming operation, the word line programming voltage WL increases to the third voltage level PWL3, the bit line programming voltage BL maintains to 3.6 volt, and the bit line address signal BL_ADDRESS maintains the logic high voltage level. Then, in the 1 μs fourth programming slot of the 5.4 μs first programming operation, the word line programming voltage WL increases to the fourth voltage level PWL4 (such as 9.5 volt), the bit line programming voltage BL maintains to 3.6 volt, and the bit line address signal BL_ADDRESS maintains the logic high voltage level.

Next, in the 0.4 μs reset slot RST of the 5.4 μs first programming operation, the word line programming voltage WL decreases to the specific low voltage level, the bit line programming voltage BL decreases to the logic low voltage level, and the bit line address signal BL_ADDRESS decreases to the logic low voltage level. Then, in the 0.4 μs back verification slot VFY of the 5.4 μs first programming operation, the word line programming voltage WL increases to 7 volt, the bit line programming voltage BL increases slightly but from the logic low voltage level, and the bit line address signal BL_ADDRESS maintains the logic low voltage level.

Next, in the 0.4 μs transient slot of the 3 μs second programming operation, the word line programming signal WL increases to the third voltage level PWL3, the bit line programming voltage BL increases to 3.6 volt, and the bit line address signal BL_ADDRESS maintains the logic low voltage level. Next, in the 0.8 μs first programming slot of the 3 μs second programming operation, the word line programming voltage WL maintains the third voltage level PWL3, the bit line programming voltage BL maintains to 3.6 volt, and the bit line address signal BL_ADDRESS maintains the logic high voltage level. Then, in the 1 μs second programming slot of the 3 μs second programming operation, the word line programming voltage WL increases to the fourth voltage level PWL4, the bit line programming voltage BL maintains to 3.6 volt, and the bit line address signal BL_ADDRESS maintains the logic high voltage level.

Next, in the 0.4 μs reset slot RST of the 3 μs second programming operation, the word line programming voltage WL decreases to the specific low voltage level, the bit line programming voltage BL decreases to the logic low voltage level, and the bit line address signal BL_ADDRESS decreases to the logic low voltage level. Then, in the 0.4 μs back verification slot VFY of the 3 μs second programming operation, the word line programming voltage WL increases to 7 volt, the bit line programming voltage BL increases slightly but from the logic low voltage level, and the bit line address signal BL_ADDRESS maintains the logic low voltage level.

Next, in the 0.4 μs transient slot of the 2 μs third programming operation, the word line programming signal WL increases to the fourth voltage level PWL4, the bit line programming voltage BL increases to 3.6 volt, and the bit line address signal BL_ADDRESS maintains the logic low voltage level. Next, in the 0.8 μs programming slot of the 2 μs third programming operation, the word line programming voltage WL maintains the fourth voltage level PWL4, the bit line programming voltage BL maintains to 3.6 volt, and the bit line address signal BL_ADDRESS maintains the logic high voltage level.

Next, in the 0.4 μs reset slot RST of the 2 μs third programming operation, the word line programming voltage WL decreases to the specific low voltage level, the bit line programming voltage BL decreases to the logic low voltage level, and the bit line address signal BL_ADDRESS decreases to the logic low voltage level. Then, in the 0.4 μs back verification slot VFY of the 2 μs third programming operation, the word line programming voltage WL increases to 7 volt, the bit line programming voltage BL increases slightly but from the logic low voltage level, and the bit line address signal BL_ADDRESS maintains the logic low voltage level.

In short, the word line programming signal WL increases from a first level PWL1 to a fourth level PWL4 step by step in the first programming operation, that is the word line programming signal WL maintains the first level PWL1 in the first programming slot of the first programming operation, next rises to and maintains the second level PWL2 in the second programming slot of the first programming operation, then rises to and maintains the third level PWL3 in the third programming slot of the first programming operation, and finally rises to and maintains the fourth level PWL4 in the fourth programming slot of the first programming operation. Next, the word line programming signal WL increases from a third level PWL3 to a fourth level PWL4 step by step in the second programming operation, that is the word line programming signal WL maintains a third level PWL3 in the first programming slot of the second programming operation, and finally rises to and maintains the fourth level PWL4 in the second programming slot of the second programming operation. Then, the word line programming signal WL maintains the fourth voltage level PWL4 in the programming slot of the third programming operation. The bit line programming signal BL increases to 3.6 volt before the first programming slot of the programming operation starts, and maintains 3.6 volt in the programming slots. The bit line address signal BL_ADDRESS maintains the logic high voltage level merely in the programming slots.

Next, referring to FIG. 2B, FIG. 2B is a waveform diagram showing a word line programming signal, a bit line programming signal at bit lines, and a bit line address signal according to another exemplary embodiment of the present disclosure. Being different from the exemplary embodiment of FIG. 2A, the bit line address signal BL_ADDRESS selectively comprises 2 bits BL_ADDRESS[0] and BL_ADDRESS[1], and the first programming operation has 8.6 μs. The bit line programming signal BL is output as at least one of the bit line signals BL[0] through BL[15] according to the bit BL_ADDRESS[0], and the bit line programming signal BL is output as at least one of the bit line signals BL[16] through BL[31] according to the bit BL_ADDRESS[1]. The bits BL_ADDRESS[0] and BL_ADDRESS[1] are respectively at the logic high level in the front 0.8 μs and back 0.8 μs of the 1.6 μs first programming slot of the first programming operation, and respectively at the logic high level in the front 1 μs and back 0.8 μs of the 1.8 μs second and third programming slots of the first programming operation (i.e. the memory cells of the bit line groups 101 and 102 are separately programmed in the first programming operation). The bits BL_ADDRESS[0] and BL_ADDRESS[1] are simultaneously at the logic high level in the programming slots of the second and third programming operations.

Then, please refer to FIG. 2C. FIG. 2C is a waveform diagram showing a word line programming signal, a bit line programming signal at bit lines, and a bit line address signal according to another exemplary embodiment of the present disclosure. Being different from the exemplary embodiment of FIG. 2A, the bit line address signal BL_ADDRESS comprises 2 bits BL_ADDRESS[0] and BL_ADDRESS[1], and the first through third programming operations respectively have 8.6 μs, 4.8 μs, and 2.8 μs. The bit line programming signal BL is output as at least one of the bit line signals BL[0] through BL[15] according to the bit BL_ADDRESS[0], and the bit line programming signal BL is output as at least one of the bit line signals BL[16] through BL[31] according to the bit BL_ADDRESS[1]. The bits BL_ADDRESS[0] and BL_ADDRESS[1] are respectively at the logic high level in the front 0.8 μs and back 0.8 μs of the 1.6 μs first programming slot of the first programming operation, in the front 0.8 μs and back 0.8 μs of the 1.6 μs first programming slot of second programming operation, and in the front 0.8 μs and back 0.8 μs of the 1.6 μs programming slot of third programming operation. Furthermore, the bits BL_ADDRESS[0] and BL_ADDRESS[1] are respectively at the logic high level in the front 1 μs and back 0.8 μs of the 1.8 μs second programming slots of the first and second programming operations, and in the front 1 μs and back 0.8 μs of the 1.8 μs second programming slots of the second programming operation. That is, the memory cells of the bit line groups 101 and 102 are separately programmed in each of the programming operations.

[Exemplary Embodiment of Method for Programming Selected Memory Cells in Nonvolatile Memory Device]

Figure 3:
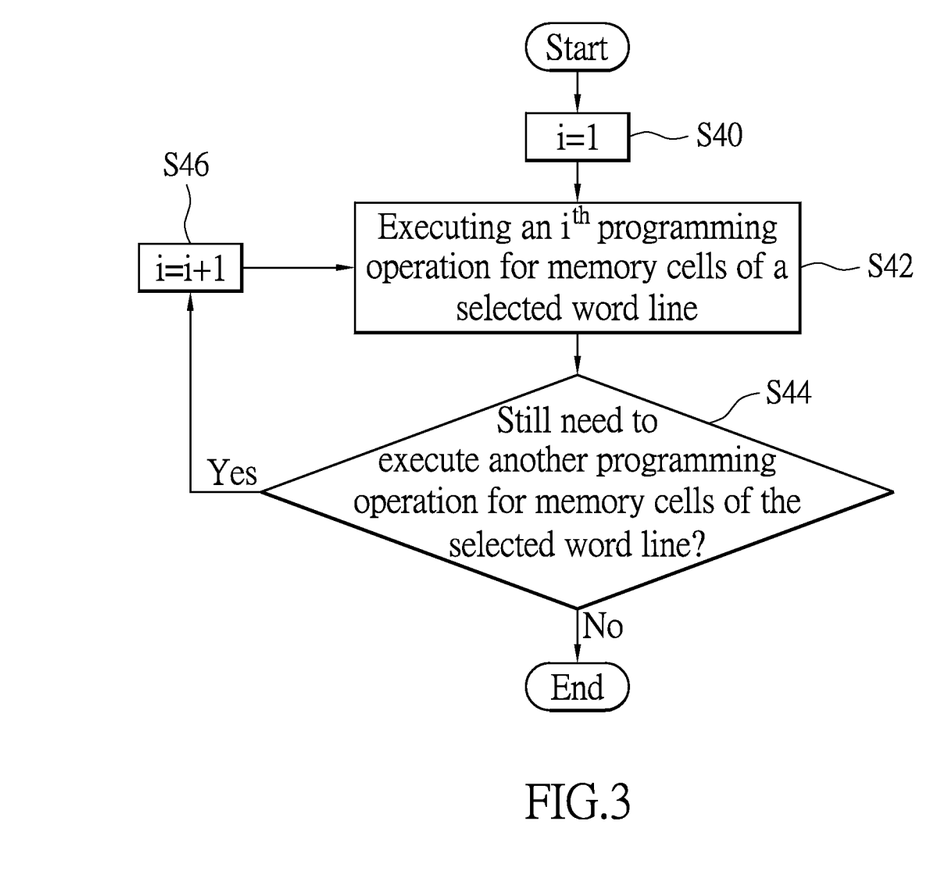
FIG. 3 is a flow chart showing a method for programming selected memory cells in a nonvolatile memory device according to an exemplary embodiment of the present disclosure.

Referring to FIG. 4, FIG. 4 is a flow chart showing a method for programming selected memory cells in a nonvolatile memory device according to an exemplary embodiment of the present disclosure. The method herein can be executed in the nonvolatile memory device as mentioned above, but the present disclosure is not limited thereto.

At step S40, a programming operation index i is initialized to be 1. Then, at step S42, an $i^{th}$ programming operation for memory cells of a selected word line is executed. Then at step S44, checking whether another programming operation for the memory cells of the selected word line must executed. If another programming operation for the memory cells of the selected word line must executed, step S46 is executed to update the programming operation index i by increasing 1, i.e. i=i+1; otherwise, the method is terminated.

In the $i^{th}$ programming operation, the word line programming signal WL changes to a specific voltage (such as 7 volt) before the memory cells of the selected word line is programmed. Then, the memory cells of the selected word line are programmed in at least one of programming slots, the word line programming signal is a ramp voltage signal being at different voltage levels in the different programming slots. The highest voltage level of the $i^{th}$ and $(i+1)^{th}$ programming operation are substantially identical to each other, and the number of the voltage levels associated with the word line programming signal WL in the $i^{th}$ programming operation is larger than the number of the voltage levels associated with the word line programming signal WL in the $(i+1)^{th}$ programming operation. Furthermore, the memory cells of the selected word line in the different bit line groups can be programmed separately or simultaneously in the programming slot.

[Possible Result of Exemplary Embodiment]

Accordingly, the method for programming selected memory cells in a nonvolatile memory device and the nonvolatile memory device thereof provided by the exemplary embodiments of the present disclosure can fast program the memory cells of the selected word line, and the voltage drops on the bit lines are lowered.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A method for programming memory cells of a selected word line associated with a nonvolatile memory device, comprising:
   providing a first word line programming signal being at plurality of voltage levels in different programming slots of a current programming operation to the memory cells of the selected word line, wherein the first word line programming signal is a ramping voltage signal; and
   providing a second word line programming signal being at plurality of voltage levels in different programming slots of a next programming operation to the memory cells of the selected word line, wherein the second word line programming signal is another one ramping voltage signal;
   wherein a highest voltage level of the first word line programming signal is the same as that of the second word line programming signal, and a number of the voltage levels of the first word line programming signal is larger than that of the second word line programming signal.

2. The method according to claim 1, wherein the memory cells of the selected word line in different bit line groups are simultaneously programmed in the current and next programming operations.

3. The method according to claim 2, wherein one of the different bit line groups comprises 16 bit lines, and another one of the different bit line groups comprises another 16 bit lines.

4. The method according to claim 1, wherein the memory cells of the selected word line in different bit line groups are separately programmed in the current programming operation and simultaneously programmed in the next programming operation.

5. The method according to claim 4, wherein one of the different bit line groups comprises 16 bit lines, and another one of the different bit line groups comprises another 16 bit lines.

6. The method according to claim 1, wherein the memory cells of the selected word line in different bit line groups are separately programmed in the current and next programming operations.

7. The method according to claim 6, wherein one of the different bit line groups comprises 16 bit lines, and another one of the different bit line groups comprises another 16 bit lines.

8. The method according to claim 1, wherein before the memory cells of the selected word line are programmed, the word line programming signal changes to a first specific level; after the memory cells of the selected word line are programmed, the word line programming signal decreases to a second specific level.

9. An nonvolatile memory device, comprising:
a memory array, comprising a plurality of memory cells; and
a bit line decoder and a word line decoder, electrically connected to the memory array;
a first high voltage generator, electrically connected to the word line decoder, the first high voltage generator provides a first word line programming signal being at plurality of voltage levels in different programming slots of a current programming operation to the memory cells of the selected word line, wherein the first word line programming signal is a ramping voltage signal; and then the first high voltage generator provides a second word line programming signal being at plurality of voltage levels in different programming slots of a next programming operation to the memory cells of the selected word line, wherein the second word line programming signal is another one ramping voltage signal; and
a second high voltage generator, electrically connected to the bit line decoder, outputting a bit line programming voltage, and the bit line decoder outputs the bit line programming voltage as at least of bit line signals;
wherein a highest voltage level of the first word line programming signal is the same as that of the second word line programming signal, and a number of the voltage levels of the first word line programming signal is larger than that of the second word line programming signal.

10. The nonvolatile memory device according to claim 9, wherein the memory cells of the selected word line in different bit line groups are simultaneously programmed in the current and next programming operations.

11. The nonvolatile memory device according to claim 10, wherein one of the different bit line groups comprises 16 bit lines, and another one of the different bit line groups comprises another 16 bit lines.

12. The nonvolatile memory device according to claim 9, wherein according to the bit line address signal received by the bit line decoder, the memory cells of the selected word line in different bit line groups are separately programmed in the current programming operation and simultaneously programmed in the next programming operation.

13. The nonvolatile memory device according to claim 12, wherein one of the different bit line groups comprises 16 bit lines, and another one of the different bit line groups comprises another 16 bit lines.

14. The nonvolatile memory device according to claim 9, wherein according to the bit line address signal received by the bit line decoder, the memory cells of the selected word line in different bit line groups are separately programmed in the current and next programming operations.

15. The nonvolatile memory device according to claim 14, wherein one of the different bit line groups comprises 16 bit lines, and another one of the different bit line groups comprises another 16 bit lines.

16. The nonvolatile memory device according to claim 9, wherein before the memory cells of the selected word line are programmed, the word line programming signal changes to a first specific level; after the memory cells of the selected word line are programmed, the word line programming signal decreases to a second specific level.

* * * * *